(12) United States Patent
Chang

(10) Patent No.: US 8,349,739 B2
(45) Date of Patent: Jan. 8, 2013

(54) CONFORMAL ETCH MATERIAL AND PROCESS

(75) Inventor: Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 599 days.

(21) Appl. No.: 12/546,812

(22) Filed: Aug. 25, 2009

(65) Prior Publication Data

US 2010/0055923 A1  Mar. 4, 2010

Related U.S. Application Data

(60) Provisional application No. 61/092,927, filed on Aug. 29, 2008.

(51) Int. Cl.
*H01L 21/302* (2006.01)

(52) U.S. Cl. ............ 438/689; 216/41; 216/83; 216/96; 216/97; 216/99; 216/101; 438/745

(58) Field of Classification Search .................. 438/689, 438/745
See application file for complete search history.

(56) References Cited

U.S. PATENT DOCUMENTS

| 4,632,727 | A | * | 12/1986 | Nelson | 216/106 |
| 4,781,792 | A | * | 11/1988 | Hogan | 216/36 |
| 6,329,300 | B1 | * | 12/2001 | Yamamoto | 438/745 |
| 6,696,327 | B1 | * | 2/2004 | Brask et al. | 438/197 |
| 7,147,798 | B2 | * | 12/2006 | Gonzalez et al. | 252/79.1 |
| 2005/0009342 | A1 | * | 1/2005 | Chen et al. | 438/689 |
| 2005/0019498 | A1 | * | 1/2005 | Osawa | 427/331 |
| 2005/0218372 | A1 | * | 10/2005 | Brask et al. | 252/79.1 |
| 2006/0237127 | A1 | * | 10/2006 | Inatomi | 156/272.2 |

OTHER PUBLICATIONS

W. Chang et al., Journal of Vacuum Science and Technology B, vol. 25(4), pp. 1265-1269, 2007.*
H. Xiao, Textbook—Introduction to Semiconductor Manufacturing Technology, published by Prentice Hall, 2001, ISBN 0-13-022404-9, pp. 313-315.*

* cited by examiner

*Primary Examiner* — Lan Vinh
*Assistant Examiner* — Jiong-Ping Lu
(74) *Attorney, Agent, or Firm* — Haynes and Boone, LLP

(57) ABSTRACT

The present disclosure provides a method for etching a substrate. The method includes forming a resist pattern on the substrate; applying an etching chemical fluid to the substrate, wherein the etching chemical fluid includes a diffusion control material; removing the etching chemical fluid; and removing the resist pattern.

20 Claims, 6 Drawing Sheets

Fig. 1a                                    Fig. 1b

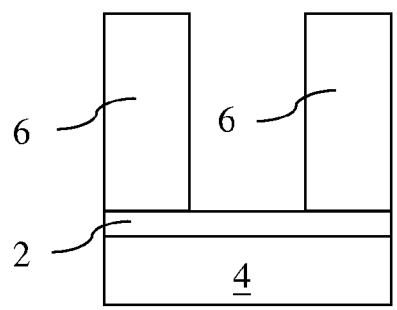
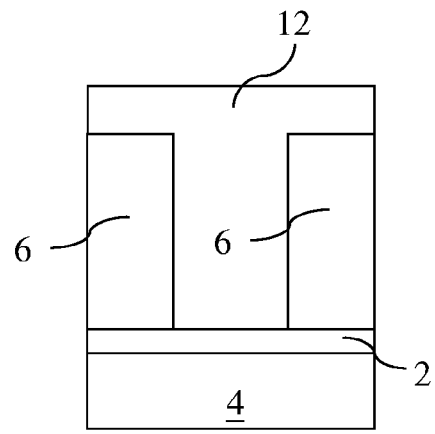
Fig. 2a
Fig. 2b
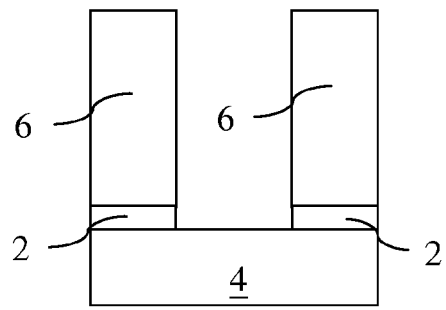
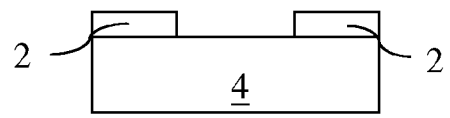
Fig. 2c
Fig. 2d

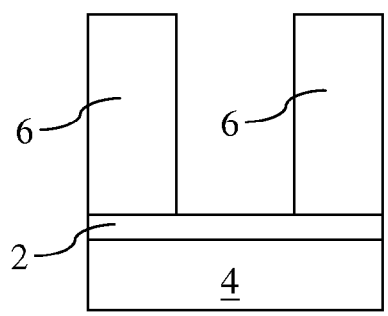
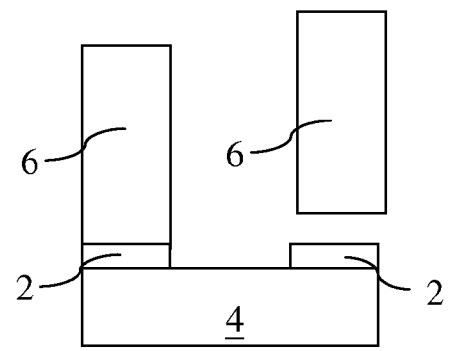
Fig. 3a　　　　　　　　　　　Fig. 3b
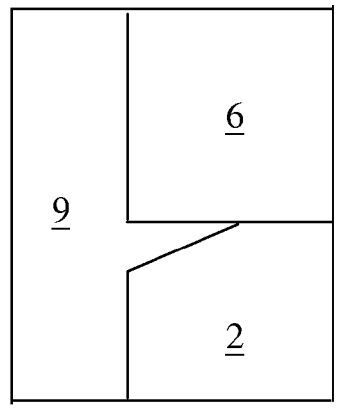
Fig. 3c

Fig. 5a                    Fig. 5b

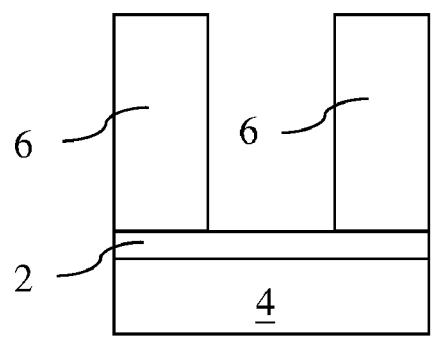
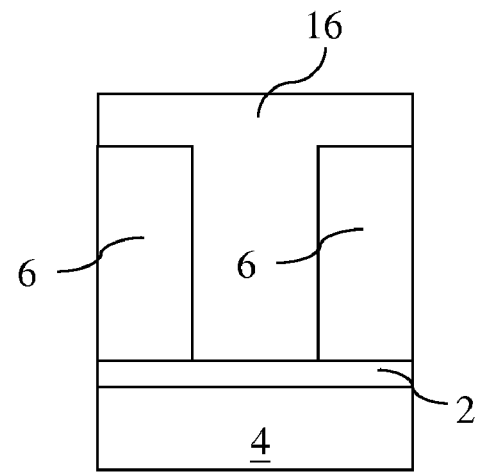
Fig. 6a          Fig. 6b
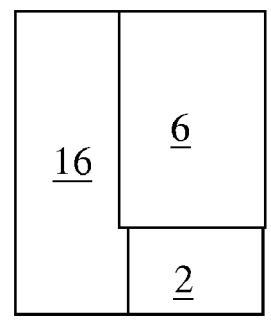
Fig. 6c

CONFORMAL ETCH MATERIAL AND PROCESS

PRIORITY DATA

This application claims priority to Provisional Application Ser. No. 61/092,927 filed on Aug. 29, 2008, entitled "Conformal Etch Material and Process," the entire disclosure of which is incorporated herein by reference.

BACKGROUND

To make an integrated circuit, various material layers are patterned using a photolithography process. The photolithography process includes photoresist (resist) coating, exposing and developing. Currently, when forming a resist patterning on wafer substrate having a material layer, such as metal film, the substrate can be etched by wet chemical. Additional rinse may be applied thereafter.

However, the current wet chemical etch has various issues. The wet chemical etch cannot have good etch selectivity between and significant lateral etch. In other words, the film underlying the resist pattern is substantially etched away without resist protection. This may further cause resist peeling. In addition, the resist pattern cannot be properly transferred the underlying film due to the lateral etch. The wet chemical etch cannot have good etch rate control since the etch rate is too high even the etchant concentration is dilute or temperature is reduced. This further worsens the lateral etch issue. The wet etch chemical has high penetration capability, such as by capillary force, and is able to penetrate into the interface between the resist and the material layer on the substrate. Such chemical penetration could also cause resist peeling and unexpected etching effect to the material layer underlying the resist pattern.

SUMMARY

One of the broader forms of an embodiment of the present invention involves a method for etching a substrate. The method includes forming a resist pattern on the substrate; applying an etching chemical fluid to the substrate, where the etching chemical fluid includes a diffusion control material; removing the etching chemical fluid; and removing the resist pattern.

Another one of the broader forms of an embodiment of the present invention involves a method for etching a substrate. The method includes forming a resist pattern on a semiconductor substrate having a high k dielectric material layer and a metal layer on the high k dielectric material layer; applying an etching chemical fluid to the metal layer, where the etching chemical fluid includes an additive to increase viscosity of the etching chemical fluid; removing the etching chemical fluid; and removing the resist pattern.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a PowerPoint format. Particularly, FIGS. 1a through 6c illustrate sectional views of a semiconductor structure at various fabrication stages constructed according to various aspects of the present disclosure in various embodiment.

DETAILED DESCRIPTION

Figure 1C:
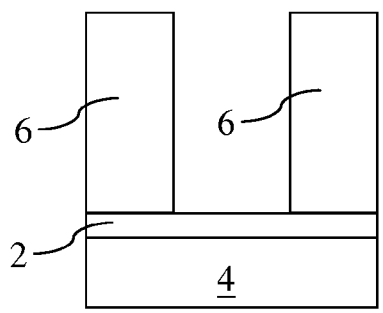
Figure 1C:
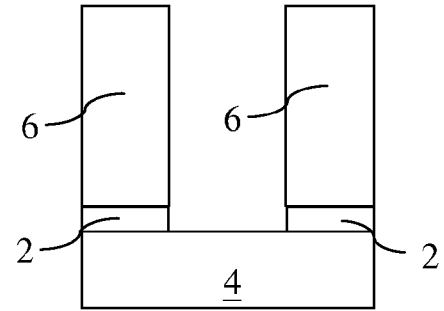
Figure 1C:
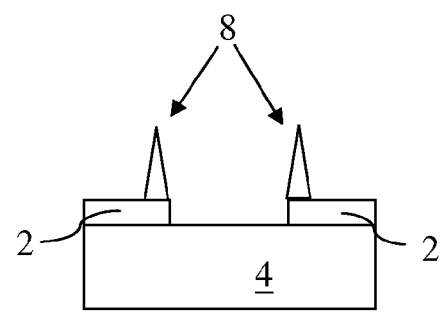

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIGS. 1a through 1c are sectional views of one embodiment of a semiconductor structure at various fabrication stages. Referring to FIG. 1a, the semiconductor structure includes a semiconductor wafer, a first material layer 2 (or "substrate 1") disposed on a second material layer 4 (or "substrate 2"), and the second material layer 4 disposed on the wafer. The first material layer 2 includes a metal film, metal oxide, or oxide. The second material layer 4 includes oxide, metal oxide, metal, or silicon. A patterned photoresist (resist) 6 is formed on the substrate 1 to pattern the first material layer 2 or additionally pattern the second material layer 4 as well. A wet etching process is applied to the first material layer and remove the first material layer 2 within the openings defined by the patterned resist, using a conventional etch solution, as illustrated in FIG. 1b. Then the patterned resist is stripped after the wet etching process. However, organic residue 8, as illustrated in FIG. 1c, may present in resist sidewall region after the resist strip.

FIGS. 2a through 2d are sectional views of one embodiment of a semiconductor structure at various fabrication stages. The semiconductor structure includes a semiconductor wafer, a first material layer 2 (or "substrate 1") disposed on a second material layer 4 (or "substrate 2"), and the second material layer 4 disposed on the wafer. The first material layer 2 includes a metal film, metal oxide, silicon or oxide. The second material layer 4 includes oxide, metal, metal oxide, or silicon.

A patterned photoresist (resist) 6 is formed on the substrate to pattern the first material layer 2 or additionally the second material layer 4 as well. A wet etching process is applied to the first material layer to remove the first material layer within the openings defined by the patterned resist, using a conformal etch material (solution) 12 having a diffusion control material incorporated into the etch solution. The diffusion control material is physically distributed in the etch solution or chemically attached to the etchant is tunable to increase the viscosity of the etch solution and chemically change the etch solution to reduce the penetration and the lateral etch rate. A rinse step may be implemented to remove the etch solution after the completion of the etch. Then the patterned resist is stripped after the wet etching process. In this case, organic residue is eliminated from after the resist strip.

FIGS. 3a through 3c are sectional views of another embodiment of a semiconductor structure at various fabrication stages. The semiconductor structure includes a semiconductor wafer, a first material layer 2 (or "substrate 1") disposed on a second material layer 4 (or "substrate 2"), and the second material layer 4 disposed on the wafer. The first material layer 2 includes a metal film, metal oxide, silicon or oxide. The second material layer 4 includes metal, metal oxide, silicon, or oxide. A patterned resist 6 is formed on the first material layer 2 to pattern the first material layer or additionally pattern the second material layer 4 as well. A conventional wet etching process is applied to the first material layer to remove the first material layer 2 within the openings defined by the patterned resist. Then the patterned resist is stripped after the wet etching process. However, the conventional wet etch chemical 9 would penetrate into the interface between the first material layer 2 and resist 6 or between the first material layer 2 and the second material layer 4, such as illustrated in FIG. 3c as a portion of the semiconductor structure in FIG. 3b. The first material layer 2 in the penetrated region is etched and the adhesion of the resist layer in that region is degraded. The resist is thus peeled during or after wet chemical etch, as illustrated in FIG. 3b. The surface of the first material layer 2 underlying the patterned resist 6 at the opening edge is damaged. The resist pattern cannot be properly transferred to the wafer.

Figure 4A:
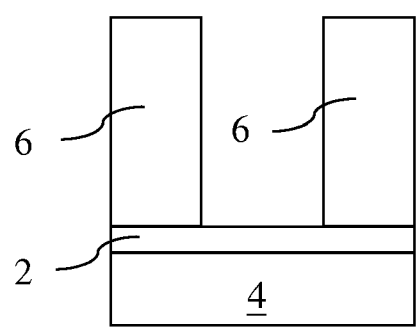
Figure 4B:
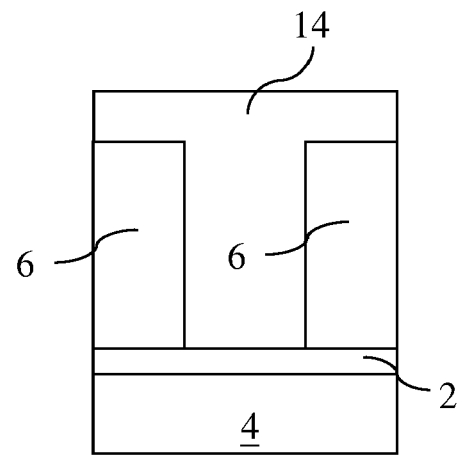
Figure 4C:
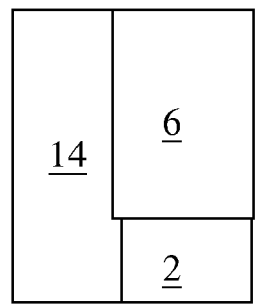

FIGS. 4a through 4c are sectional views of one embodiment of a semiconductor structure at various fabrication stages. The semiconductor structure includes a semiconductor wafer, a first material layer 2 disposed on a second material layer 4, and the second material layer 4 disposed on the wafer. The first material layer 2 includes a metal film, metal oxide, silicon, or oxide. The second material layer 4 includes metal, metal oxide, silicon, or oxide. A patterned resist 6 is formed on the first material layer 2 to pattern the first material layer 2 or additionally the second material layer 4 as well. A wet etching process applied to the first material layer 2 to remove the first material layer within the openings defined by the patterned resist 6, using a conformal etch material 14. The conformal etch material 14 contains an etch chemical that can only diffuse in short distance. Therefore, the first material layer 2 is etched with a conformal profile without penetration into the interface between the resist pattern 6 and the first material layer 2 or between the first material layer 2 and the second material layer 4, as illustrated in FIG. 4b and further illustrated in FIG. 4c. FIG. 4c is a portion of the semiconductor structure in FIG. 4b. A rinse step may be implemented to remove the etch solution after the completion of the etch. Then the patterned resist is stripped after the wet etching process.

Figure 5C:
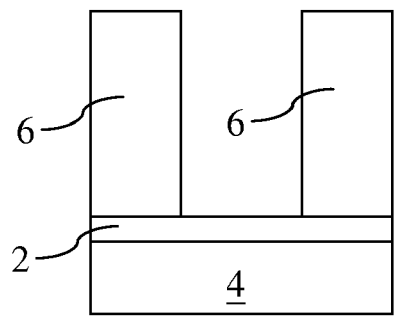
Figure 5C:
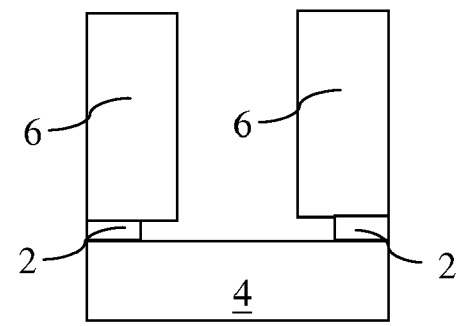
Figure 5C:
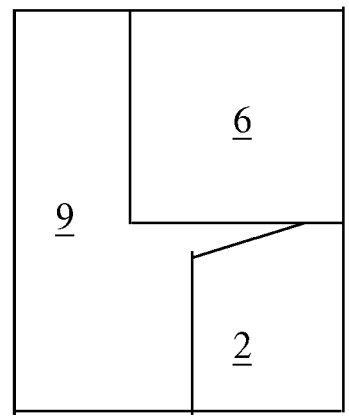

FIGS. 5a through 5c are sectional views of another embodiment of a semiconductor structure at various fabrication stages. The semiconductor structure includes a semiconductor wafer, a first material layer 2 disposed on a second material layer 4, and the second material layer 4 disposed on the wafer. The first material layer 2 includes a metal film, metal oxide, silicon or oxide. The second material layer 4 includes metal, metal oxide, silicon, or oxide. A patterned resist 6 is formed on the first material layer 2 to pattern the first material layer 2 or additionally pattern the second material layer 4 as well. A conventional wet etching process is applied to the first material layer to remove the first material layer 2 within the openings defined by the patterned resist 6. Then the patterned resist 6 is stripped after the wet etching process. However, the conventional wet etch chemical would penetrate the interface between the substrate and resist since the conventional wet chemical has good hydrodynamic flow and high etch rate that can continuously supply fresh chemical to the lateral area. Thus, the lateral area under the resist is etched in a high etch rate, causing pattern transferring failure, as illustrated in FIG. 5b and further illustrated in FIG. 5c. FIG. 5c is a portion of the semiconductor structure in FIG. 5b.

FIGS. 6a through 6c are sectional views of one embodiment of a semiconductor structure at various fabrication stages. The semiconductor structure includes a semiconductor wafer, a first material layer 2 disposed on a second material layer 4, and the second material layer 4 disposed on the wafer. The first material layer 2 includes a metal film, metal oxide, silicon or oxide. The second material layer 4 includes a metal film, metal oxide, silicon, or oxide. A patterned resist 6 is formed on the first material layer 2 to pattern the first material layer 2 or additionally the second material layer 4 as well. A wet etching process is applied to the first material layer 2 to remove the first material layer 2 within the openings defined by the patterned resist 6, using a conformal etch material 16. The conformal etch material 16 contains an etch chemical that has a reduced diffusion ability. Therefore, the first material layer 2 is etched into a conformal profile without the degradation from the lateral etch, as illustrated in FIG. 6b and further illustrated FIG. 6c. FIG. 6c is a portion of the semiconductor structure in FIG. 6b. A rinse step may be implemented to remove the etch solution after the completion of the etch. Then the patterned resist 6 is stripped after the wet etching process. In this case, organic residue is eliminated after the resist strip.

In this disclosed method, the conformal etch material is used to pattern a material layer using the patterned resist as an etch mask. The conformal etch material is a polymer-based etchant and has a significantly controlled viscosity and/or diffusion ability during an etching process. In various embodiment, the conformal etch material includes a polymer based diffusion control material physically distributed in the etch solution or chemically attached to the etchant such that the conformal etch material is tunable to have an increased viscosity, stereo effect, retardant by ion force attraction, retardant by chemical bonding to etchant or surface tension to reduce the etch solution penetration and the lateral etch rate.

In various embodiment, the conformal etch material includes an acid polymer. In one example, the acid polymer is a polymer with an acid functional group. The acid functional group may be carboxylic, lactone, hydroxyl, or fluoro-alcohol functional group. In another example, the acid polymer is a polymer with acid molecular additive. The acid molecular additive may include PAG, PFOS, PFBS, perfluoroalkyl sulfonate molecuar, HCL, HF, H2SO4, HNO3 or CH3COOH. In another embodiment, the conformal etch material includes a special polymer with reactive functional group such as N tertiary structure that contain electron lone pair. In another embodiment, the conformal etch material includes weak acid solution, such as CO2 water. In another embodiment, the conformal etch material includes bulky acid solution, such as CH3COOH water. In another embodiment, the conformal etch material has a surface tension coefficient greater than about 80 dyne/cm$^2$.

The conformal etch material may additionally include HCL/H2O mixture, HCL/H2O2/H2O mixture, NH4OH/H2O mixture, NH4OH/H2O2/H2O mixture, HNO3/HF/CH3COOH mixture, HF/H2O mixture, HF/H2O2/H2O mixture, TMAH/H2O mixture, in various applications. In another embodiment, the wafer or the conformal etch solution is heated when applying the conformal etch material to the substrate or after the applying of the conformal etch material. The etch process temperature ranges from about 5 to about 120 degree Celsius.

In various example, the material layer, formed on the substrate and to be etched using the conformal etch material, may includes a metal material selected from the group consisting of LaxOy, HfxOy, AlxOy, TixOy, TixNy, TaN, W, WxOy, Ti, and Al. In other examples, the material layer may include an inorganic material selected from the group consisting of Si, SiO2, Si3N4, SOG, PSG, BSG and BPSG.

In one embodiment, the disclosed etch method include forming a resist pattern on metal substrate, forming a conformal etch fluid on the resist pattern, removing the conformal etch fluid, and removing the resist pattern. In one embodiment, the conformal etch fluid includes a solvent selected from the group consisting of PGME, PGMEA, cyclohexanol, NMP, acetone, propylene glycol, TMAH, DPGMEA, 1-amino-2-propanol and N-(2-aminoethyl)ethanolamine. The conformal etch fluid cannot solve the resist pattern. The conformal etch fluid includes TMAH developer, solvent, or DI water. The solvent is alcohol base solvent, such as isobutanol, n-butanol, and MIBC.

In one particular example, the etch method utilizing the conformal etch material can be applied to form metal gate stacks of an integrated circuit. Various metal-gate-stack material layers are formed on a semiconductor substrate. A high k dielectric material layer is formed on the semiconductor substrate. A metal gate layer is formed on the high k dielectric material layer. A capping layer may be further interposed between the high k dielectric material layer and the metal gate layer. In one embodiment, the high k dielectric material includes HfO2. In another embodiment, the high k dielectric material includes Al2O3. Alternatively, the high k dielectric material layer includes metal nitrides, metal silicates or other metal oxides. The metal gate layer includes titanium nitride. In another embodiment, the metal gate layer includes tantalum nitride, molybdenum nitride or titanium aluminum nitride. The capping layer may include lanthanum oxide (LaO) or other suitable material. Then one or more etch processes are applied to the substrate to form the patterned metal gate stack, using the conformal etch material.

Although not shown, other processing step may be performed before or after to form various doped regions such as source and drain regions, devices features such as multilayer interconnection (MLI). In one example, the light doped drain (LDD) regions are formed after the formation of the gate stack. A gate spacer may be formed on the sidewalls of the metal gate stack. Then the source and drain regions are formed substantially aligned with the outer edges of the spacers. The multilayer interconnection are further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes. The semiconductor substrate may further include additional isolation features to isolate each from other devices. The isolation features may include different structures and can be formed using different processing technologies. For example, an isolation feature may include shallow trench isolation (STI) features.

Although embodiments of the present disclosure have been described in detail, those skilled in the art should understand that they may make various changes, substitutions and alterations herein without departing from the spirit and scope of the present disclosure. In one embodiment, the disclosed method is used to form an n-type metal-oxide-semiconductor field-effect-transistor (NMOSFET). In another embodiment, the disclosed method is used to form a metal gate stack in a gate-first process in which the metal gate stack is formed by the disclosed method and remains in the final structure. In another embodiment, the disclosed method is used to form a metal gate stack in a hybrid process in which the first type metal gate stack (such as NMOS metal gate stack) is formed by the method 100 and remains in the final structure. The second type of the metal gate stack (such as PMOS metal gate stack) is formed as a dummy gate structure so that source/drain ion implantation processes and annealing processes can be implemented. Thereafter, a portion of the dummy gate stack is removed and the dummy gate trench is refilled with proper materials. For example, the polysilicon layer and metal layer in the PMOS region are removed. Then p metal is refilled and another metal such as copper is further filled in to form PMOS metal gate stack.

In another embodiment, the semiconductor substrate may include an epitaxial layer. For example, the substrate may have an epitaxial layer overlying a bulk semiconductor. Further, the substrate may be strained for performance enhancement. For example, the epitaxial layer may include a semiconductor material different from those of the bulk semiconductor such as a layer of silicon germanium overlying a bulk silicon, or a layer of silicon overlying a bulk silicon germanium formed by a process including SEG. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

The patterned resist is formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint. The resist is sensitive to particular exposure beam such KrF, ArF, EUV or e-beam light. In on example, the patterned resist includes chemical amplifier (CA) for 0.25 micron or advanced technology nodes. The CA resist includes both photoacid generator (PAG).

Various advantages may present in different embodiment and applications of the present disclosure. It is understood that different embodiments offer different advantages and that no particular advantage is necessarily required for all embodiments. These advantages include improving the under and lateral etch rate without chemical penetration to resist covered substrate; controlling the etch rate by controlling the effective reaction chemical with polymer; controlling the etch chemical concentration by controlling the effective chemical with polymer; decreasing the capillary force or penetration phenomena by controlling the acid diffusion length using hybrid chemical with polymer; being applicable to a higher substrate temperature using a hot plate. Additionally, after baking process, the polymer residue can be eliminated. The conformal etch material can combine different chemicals for different purposes at the same etch process and etch time.

In one embodiment of the diffusion control element or structure, polymer may be used for chemical diffusion control. The chemical is added into the polymer. therefore, the diffusion of chemical is under control. In another embodiment of the conformal etch material, acid/base polymer can also be utilized in a polymer with reactive function groups.

The present disclosure provides a chemical diffusion control material and an etching process to use it. The chemical diffusion control material includes a polymer with chemical additive, polymer with functional group or chemical with large molecular structure. The chemical diffusion control material is applied to a substrate by spin coating or spray or deposition. After the diffusion control material is applied to the substrate, it may further apply a heating process by lamp or heating plate. After the etching process, the diffusion control material can be directly removed by spin dry, evaporate, or fluid rinse. The fluid rinse can be solvent, solution, or gas. The solution can be DI Water or resist developer. The substrate includes silicon or an additional film selected from the group consisting of polysilicon, nitride, oxide, and metal film. The metal film may include lanthanum oxide, hafnium oxide or aluminum oxide. It may further include forming a patterning resist on the metal film before apply chemical material on it.

Thus, the present disclosure provides a method for etching a substrate. The method includes forming a resist pattern on the substrate; applying an etching chemical fluid to the substrate, wherein the etching chemical fluid includes a diffusion control material; removing the etching chemical fluid; and removing the resist pattern.

According to various embodiments of this method, the diffusion control material may include a polymeric material with chemical additive. The diffusion control material may include a polymeric material with an acid molecular additive selected from the group consisting of PAG, PFOS, PFBS, perfluoroalkyl sulfonate molecuar, HCL, HF, H2SO4, HNO3 and CH3COOH. The diffusion control material may include a polymeric material with large molecular structure. The diffusion control material may include a polymeric material with a functional group selected from one of carboxylic, lactone, hydroxyl, and fluoro-alcohol functional group. The diffusion control material may include a polymeric material with an N tertiary structure that contain d2 lone pair. The etch chemical fluid may include CO2 water. The etch chemical fluid may include a bulky acid solution having CH3COOH water. The diffusion control material may include one of polymer, solvent and additive.

The substrate may include a material layer selected from the group consisting of LaxOy, HfxOy, AlxOy, TixOy, TixNy, TaN, W, WxOy, Ti, and Al. Inorganic substrate, for example, Si, SiO2, Si3N4, SOG, PSG, BSG and BPSG. The forming of the resist pattern may further include heating the substrate during a resist coating process. The heating of the substrate may include heating the substrate to a temperature below about 120 C. The forming of the resist pattern may further include heating the substrate after a resist coating process. The etching chemical fluid include one etchant selected from the group consisting of HCL/H2O mixture, HCL/H2O2/H2O mixture, NH4OH/H2O mixture, NH4OH/H2O2/H2O mixture, HNO3/HF/CH3COOH mixture, HF/H2O mixture, and HF/H2O2/H2O mixture.

The present disclosure also provides another embodiment of a method for etching a substrate. The method includes forming a resist pattern on a semiconductor substrate having a high k dielectric material layer and a metal layer on the high k dielectric material layer; applying an etching chemical fluid to the metal layer, wherein the etching chemical fluid includes an additive to increase viscosity of the etching chemical fluid; removing the etching chemical fluid; and removing the resist pattern.

In this method, the resist pattern may be selected from KrF resist, ArF resist, EUV resist and e-beam resist. The etching chemical fluid may include at least one of polymer, solvent, additive. The solvent may include one of organic solvent and DI water. The additive may include at least one of acid compound, base compound and nitrogen compound. The polymer may include acid polymer or nitrogen polymer.

The disclosed method further includes applying the conformal etching process to the semiconductor substrate having various metal gate stack layers to form a semiconductor device. The semiconductor device is an N-type metal-oxide-semiconductor field-effect-transistor (NMOSFET) and/or PMOSFET in one embodiment. The metal gate stack layers include a high k dielectric material layer, a metal gate layer, and a capping layer. The metal gate layer may include titanium nitride. The metal gate layer may include a conductive material selected from the group consisting of tantalum nitride, molybdenum nitride and titanium aluminum nitride. The capping layer may include lanthanum oxide (LaO). The metal gate layer may include a conductive material selected from the group consisting of titanium nitride, tantalum nitride, molybdenum nitride and titanium aluminum nitride.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for etching a semiconductor substrate comprising:
   forming a photoresist pattern on the semiconductor substrate;
   applying an etching chemical fluid to the semiconductor substrate, wherein the etching chemical fluid includes a diffusion control material, the diffusion control material including PAG;
   removing the etching chemical fluid; and
   removing the photoresist resist pattern.

2. The method of claim 1, wherein the diffusion control material comprises a polymeric material with chemical additive.

3. The method of claim 1, wherein the diffusion control material comprises a polymeric material with an acid molecular additive selected from the group consisting of PAG, PFOS, PFBS, perfluoroalkyl sulfonate, HCl, HF, H2SO4, HNO3 and CH3COOH.

4. The method of claim 1, wherein the diffusion control material comprises one of polymer, solvent and additive.

5. The method of claim 1, wherein the substrate comprises a material layer selected from the group consisting of LaxOy, HfxOy, AlxOy, TixOy, TixNy, TaN, W, WxOy, Ti, Al and an inorganic substrate selected from the group consisting of Si, SiO2, Si3N4, SOG, PSG, BSG and BPSG.

6. The method of claim 1, wherein the forming of the resist pattern further comprises heating the substrate during a resist coating process.

7. The method of claim 6, wherein the heating of the substrate comprises heating the substrate to a temperature below about 120 C.

8. The method of claim 1, wherein the forming of the resist pattern further comprises heating the substrate after a resist coating process.

9. The method of claim 1, further comprising heating the etching chemical fluid occurs while applying the etching chemical fluid to the semiconductor substrate.

10. The method of claim 1, wherein heating the etching chemical fluid on the semiconductor substrate includes heating the chemical fluid up to about 120° C.

11. The method of claim 1, further comprising after applying the etching chemical fluid, heating the etching chemical fluid on the semiconductor substrate.

12. The method of claim 1, wherein applying an etching chemical fluid to the semiconductor substrate includes performing a wet etch process.

13. The method of claim 1, wherein the substrate includes a LaxOy layer and the applying of the etching chemical fluid to the semiconductor substrate includes etching the LaxOy layer.

14. A method for etching a substrate comprising:
   forming a resist pattern on a semiconductor substrate having a high k dielectric material layer and a metal layer on the high k dielectric material layer;
   applying an etching chemical fluid to the metal layer, wherein the etching chemical fluid includes an additive to increase viscosity of the etching chemical fluid, wherein the additive is PAG;
   after applying the etching chemical fluid, heating the etching chemical fluid on the semiconductor substrate;
   removing the etching chemical fluid; and
   removing the resist pattern.

15. The method of claim 14, wherein the etching chemical fluid comprises at least one of polymer, solvent, and the additive.

16. The method of claim 15, wherein the solvent comprises one of organic solvent and DI water.

17. The method of claim 15, wherein the additive comprises at least one of acid compound, base compound and nitrogen compound.

18. The method of claim 15, wherein the polymer comprises acid polymer or nitrogen polymer.

19. The method of claim 14, wherein the high k dielectric material is LaxOy.

20. The method of claim 14, wherein the etching chemical fluid comprises at least one of polymer, solvent, and additive.

* * * * *